United States Patent
Tustaniwskyj et al.

[19]

[11] Patent Number: 6,108,208
[45] Date of Patent: *Aug. 22, 2000

[54] TESTING ASSEMBLY HAVING A PRESSED JOINT WITH A SINGLE LAYER OF THERMAL CONDUCTOR WHICH IS REUSED TO SEQUENTIALLY TEST MULTIPLE CIRCUIT MODULES

[75] Inventors: Jerry Ihor Tustaniwskyj, Mission Viejo; James Wittman Babcock, Escondido, both of Calif.

[73] Assignee: Unisys Corporation, Blue Bell, Pa.

[*] Notice: This patent issued on a continued prosecution application filed under 37 CFR 1.53(d), and is subject to the twenty year patent term provisions of 35 U.S.C. 154(a)(2).

[21] Appl. No.: 08/986,772

[22] Filed: Dec. 8, 1997

[51] Int. Cl.[7] ..................................................... H05K 7/20
[52] U.S. Cl. ........................... 361/705; 361/688; 361/690; 361/704; 361/707; 257/714; 174/16.3; 165/121; 165/185; 428/614
[58] Field of Search ..................................... 361/689, 699, 361/704–710, 717–736; 257/706–727; 174/16.3, 16.45, 52.4; 165/80.3, 80.4, 80.2, 104.32, 105, 80 C; 428/343, 614; 29/830, 832, 840, 843; 200/289; 228/180.21, 123.1

[56] References Cited

U.S. PATENT DOCUMENTS

| | | | |
|---|---|---|---|
| 4,034,468 | 7/1977 | Koopman | 29/628 |
| 4,069,498 | 1/1978 | Joshi | 357/81 |
| 4,092,697 | 5/1978 | Spaight | 361/386 |
| 4,254,431 | 3/1981 | Babuka et al | 357/82 |
| 4,558,395 | 12/1985 | Yamada et al. | 361/385 |
| 4,581,011 | 4/1986 | Kohara et al. | 356/81 |
| 4,607,277 | 8/1986 | Hassan et al. | 357/81 |
| 4,639,829 | 1/1987 | Ostergren et al. | 361/386 |
| 4,879,632 | 11/1989 | Yamamoto et al. | 361/386 |
| 5,024,264 | 6/1991 | Natori et al. | 165/1 |
| 5,144,531 | 9/1992 | Go et al. | 361/382 |
| 5,234,149 | 8/1993 | Katz et al. | 228/123.1 |

*Primary Examiner*—Gerald Tolin
*Assistant Examiner*—Michael Datskovsky
*Attorney, Agent, or Firm*—Charles J. Fassbender; Mark T. Starr; Steven B. Samuels

[57] ABSTRACT

An electromechanical assembly, having a pressed joint with a low thermal resistance which is residue free when disassembled, includes: 1) an integrated circuit module having a contact surface of a first material; 2) a temperature regulating unit having a contact surface of a second material which faces the contact surface of the first material and which is separated therefrom by a gap; and, 3) a film of a metal alloy, which substantially fills the gap, and which is limited to an alloy that adheres in a solid state to the second material but not the first material. Preferred alloys for filling the gap include combinations of two or more metals which are selected from the group of lead, tin, bismuth, cadmium, indium, and antimony. Preferred first materials for the contact surface on the integrated circuit module to which the alloy does not adhere include silicon dioxide, aluminum nitrite, silicon and ceramic. Preferred second materials for the contact surface on the temperature regulating unit to which the alloy does adhere include copper, nickel, zinc, and aluminum which is plated with copper, nickel or zinc.

7 Claims, 5 Drawing Sheets

SURFACE IN CHIP 23 FACING JACKET 15 ≈ 100% SILICON DIOXIDE
BOTTOM SECTION 15a OF JACKET 15 ≈ 100% NICKEL-PLATED COPPER
METAL ALLOY 15b ≈ 50% Bi, 25% Pb, 12.5% Sn, 12.5% Cd
TEMPERATURE OF LIQUID IN JACKET = 61°C
THERMAL RESISTANCE FROM JACKET TO LIQUID ≈ 0.1°C/W

| TIME | CHIP POWER (WATTS) | CHIP POWER (°C) | THERMAL RESISTANCE ACROSS GAP (°C/W) | STATE OF ALLOY |
|---|---|---|---|---|
| t0 | 15 | 73 | 0.70 | SOLID |
| t1 | 30 | 77.5 | 0.45 | SLURRY |
| t2 | 45 | 74.5 | 0.20 | SLURRY |
| t3 | 60 | 73 | 0.10 | SLURRY |
| t4 | 75 | 74 | 0.07 | LIQUID |
| t5 | 90 | 76.5 | 0.07 | LIQUID |
| t6 | 105 | 79 | 0.07 | LIQUID |
| t7 | 120 | 81 | 0.07 | LIQUID |
| t8 | 135 | 84 | 0.07 | LIQUID |
| t9 | 150 | 86 | 0.07 | LIQUID |
| t10 | 180 | 90.5 | 0.06 | LIQUID |
| t11 | 210 | 94.7 | 0.06 | LIQUID |
| t12 | 15 | 63.5 | 0.07 | SOLID |

TESTING ASSEMBLY HAVING A PRESSED JOINT WITH A SINGLE LAYER OF THERMAL CONDUCTOR WHICH IS REUSED TO SEQUENTIALLY TEST MULTIPLE CIRCUIT MODULES

CROSS-REFERENCES TO RELATED APPLICATION

This application shares a common Detailed Description with a co-pending application entitled "RESIDUE-FREE METHOD OF ASSEMBLING AND DISASSEMBLING A PRESSED JOINT WITH LOW THERMAL RESISTANCE", having Docket Number 550,588, which was filed concurrently with the present application.

BACKGROUND OF THE INVENTION

This invention relates to electromechanical assemblies in which heat is conducted between two components, such as an integrated circuit module and a temperature regulating unit, which are pressed together.

In the prior art, various electromechanical assemblies have been disclosed which maintain an integrated circuit chip at a certain temperature while the chip is operating. For a general background of such assemblies, see U.S. Pat. No. 4,791,983 by E. Nicol and G. Adrian entitled "Self-Aligned Liquid Cooling Assembly", and U.S. Pat. No. 4,879,629 by J. Tustaniwskyj and K. Halkola entitled "Liquid Cooled Multi-Chip Integrated Circuit Module Incorporating a Seamless Compliant Member for Leakproof Operation".

In such assemblies, heat flows between an integrated circuit chip and a temperature regulating unit along a thermal conduction path which includes one or more joints. In the case where the components of each joint are rigidly fused together, then the task of taking the joint apart in order to remove a chip is made difficult. On the other hand, in the case where a joint consists of two components that are merely pressed together, then the thermal resistance through the joint is increased.

To reduce the thermal resistance through a pressed joint, thermal greases and metal pastes have been developed. When a layer of these materials is placed in the joint, microscopic air gaps between the joined components are reduced which in turn reduces thermal resistance through the joint. Such greases and pastes are described in U.S. Pat. No. 5,056,706 by T. Dolbar, C. McKay, and R. Nelson which is entitled "Liquid Metal Paste for Thermal and Electrical Connections".

However, one drawback of a thermal grease is that its thermal conductivity is still relatively low, in comparison to the conductivity of a metal. See U.S. Pat. No. 5,056,706 at column 2, lines 24–29.

Also, another problem with the thermal grease and the metal paste is that they stick to both of the components which are pressed together in the joint. Thus, when those components are subsequently separated in order to remove a chip from the assembly, a residue portion of the grease or paste from the joint stays on both of the separated components.

If the electromechanical assembly is used to test hundreds or thousands of integrated circuit chips which are subsequently put into an end product, any grease or paste which is retained by a chip presents a problem. Specifically, the task of cleaning the residue grease/paste from each chip before the chip is put into an end product adds to the time and cost of producing the end product.

Also in the prior art, a novel pressed joint is disclosed in U.S. Pat. No. 5,323,294 by W. Layton, et al. entitled "Liquid Metal Heat Conducting Member and Integrated Circuit Package Incorporating Same." In this patent, two components are pressed together with a thin compliant body lying between them which has microscopic voids like a sponge, and a liquid metal alloy is absorbed by the compliant body and partially fills the voids.

However, one drawback of this joint is that it requires the compliant body as a carrier for the liquid metal, and this compliant body is an extra component which adds to the cost of the joint. Also, if the joint is taken apart, a portion of the liquid metal can adhere to the components that were pressing against the compliant body, and that is a residue which must be cleaned up. Further, the liquid metal in patent '294 will chemically attack aluminum and copper, and those metals often are in the electromechanical assembly. See U.S. Pat. No. 5,658,831 by W. Layton, et al, at column 7, lines 8–42. Thus, extreme care must be used to insure that no residue liquid metal is inadvertently squeezed out of the compliant body and put in contact with any aluminum or copper.

Accordingly, a primary object of the present invention is to provide an electromechanical assembly which has a thermal conduction path with a novel pressed joint that overcomes the above drawbacks of the prior art.

BRIEF SUMMARY OF THE INVENTION

In accordance with the present invention, a novel structure for an electromechanical assembly, includes: 1) an integrated circuit module having a contact surface of a first material; 2) a temperature regulating unit having a contact surface of a second material which faces the contact surface of the first material and which is separated therefrom by a gap; and, 3) a film of a metal alloy, which substantially fills the gap, and which is limited to an alloy that adheres in a solid state to the second material but not the first material.

Preferred alloys for filling the gap in the above electromechanical assembly include combinations of two or more metals which are selected from the group of lead, tin, bismuth, cadmium, indium, and antimony. Preferred first materials for the contact surface on the integrated circuit module to which the alloy does not adhere include silicon dioxide, aluminum nitrite, silicon and ceramic. Preferred second materials for the contact surface on the temperature regulating unit to which the alloy does adhere include copper, nickel, zinc, and aluminum which is plated with copper, nickel or zinc.

In one embodiment, the integrated circuit module is an unpackaged integrated circuit chip. In another embodiment, the integrated circuit module is one or more chips which are enclosed in a protective package, such as a ceramic package. In another embodiment, the integrated circuit module is one or more integrated circuit chips that are connected by their input/output terminals to a substrate, such as a printed circuit board or a ceramic substrate.

DETAILED DESCRIPTION

Figure 1:
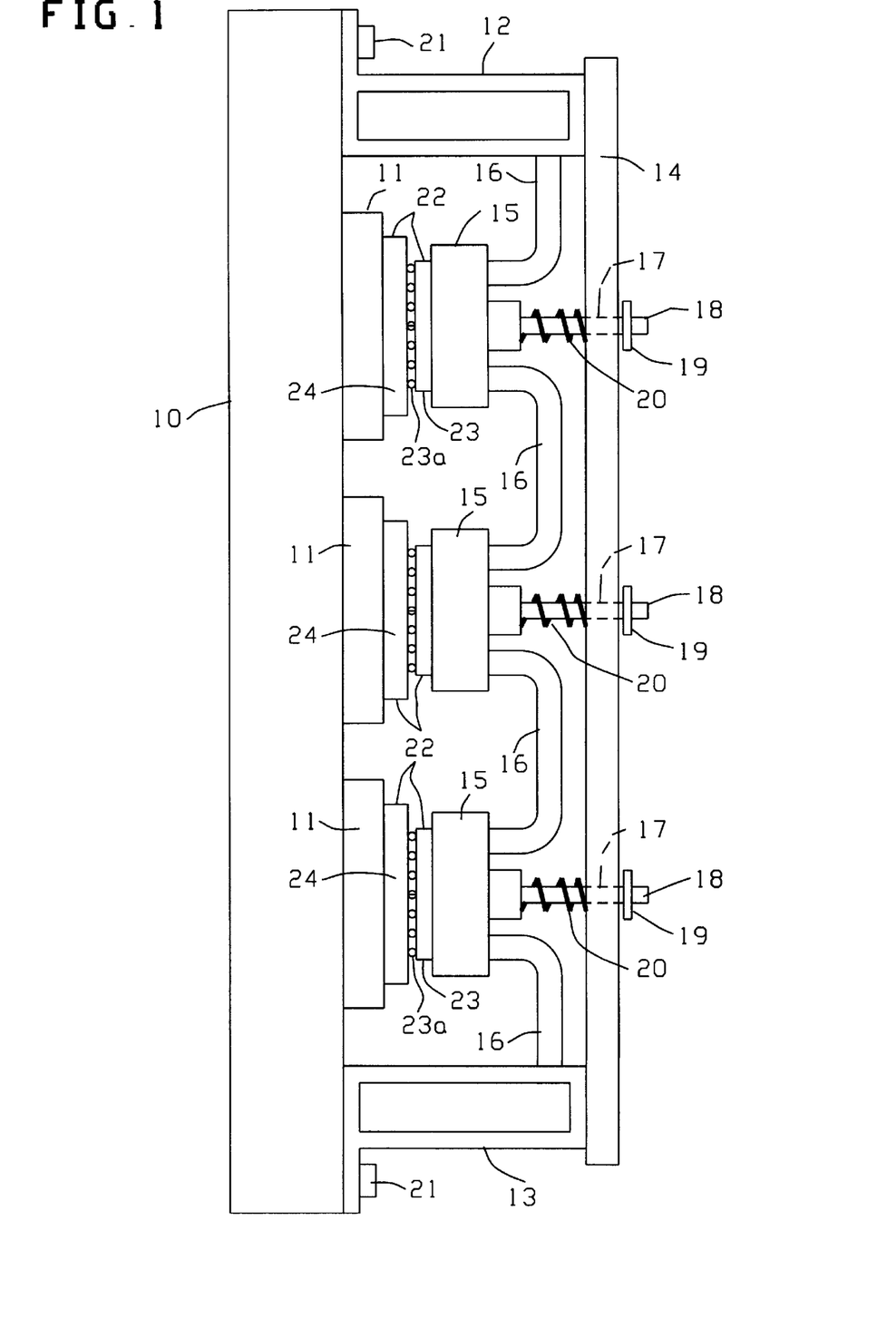
FIG. 1 shows a side view of a preferred embodiment of an electromechanical assembly which incorporates the present invention.

Referring now to FIG. 1, a preferred embodiment of an electromechanical assembly which incorporates the present invention will be described. This FIG. 1 embodiment includes several components 10–24; and each of those components is described below in Table I.

TABLE I

| ITEM | DESCRIPTION |
|---|---|
| 10 | Item 10 is a printed circuit board. |
| 11 | Each item 11 is a socket. These sockets are attached in parallel rows to the circuit board 10. Only one row is shown in FIG. 1. |
| 12 | Item 12 is an input manifold for a liquid. |
| 13 | Item 13 is an output manifold for a liquid. |
| 14 | Each item 14 is an elongated beam which is connected at its ends to the input manifold 12 and the output manifold 13. These beams lie in parallel in the FIG. 1 assembly over respective rows of sockets 11. |
| 15 | Each item 15 is a hollow jacket through which liquid passes from the input manifold 12 to the output manifold 13. |
| 16 | Each item 16 is a flexible hose. |
| 17 | Each item 17 is a hole in a beam 14. These holes are proximately aligned with the sockets 11. |
| 18 | Each item 18 is a guidepost that passes through a hole 17 and is press-fitted into one of the jackets 15. |
| 19 | Each item 19 is a retaining ring on a respective guidepost 18. |
| 20 | Each item 20 is a coil spring which is wrapped around a guidepost 18 and is compressed between a beam 14 and a jacket 15. |
| 21 | Each item 21 is a bolt which attaches the manifolds 12 and 13 to the printed circuit board. |
| 22–24 | Each item 22 is an integrated circuit module which includes an integrated circuit chip 23 and a substrate 24. Each chip has input/output terminals 23a that are attached |

TABLE I-continued

| ITEM | DESCRIPTION |
|---|---|
| | to metal pads on the top of the substrate, and each substrate has input/output terminals which are inserted into a socket 11. |

In operation, the FIG. 1 assembly is used to perform a burn-in test of the integrated circuit chips 23. During this test, each integrated circuit chip 23 receives electrical power and input test signals from the printed circuit board 10; and in response, each integrated circuit chip 23 sends output signals to the printed circuit board 10. Also, during this test, each integrated circuit chip 23 is heated to a predetermined temperature by passing a hot liquid from the input manifold 12 through the hoses 16 and jackets 15 to the output manifold 13.

To maintain the integrated circuit chips 23 at the predetermined temperature during the burn-in test, it is important to minimize the presence of any microscopic air gaps at the interface between each of the integrated circuit chips 23 and their respective jacket 15. Also, after the burn-in test is complete, it is important that each of the integrated circuit modules 22 can be removed from the FIG. 1 assembly and attached to another printed circuit board for an end product, without any residue of a foreign material (such as a thermal grease) being transferred from the chip-jacket interface to the chip 23. With the present invention, both of these objectives are accomplished by constructing the jackets 15 in a novel fashion, as will now be described in conjunction with FIGS. 2–9.

Figure 2:
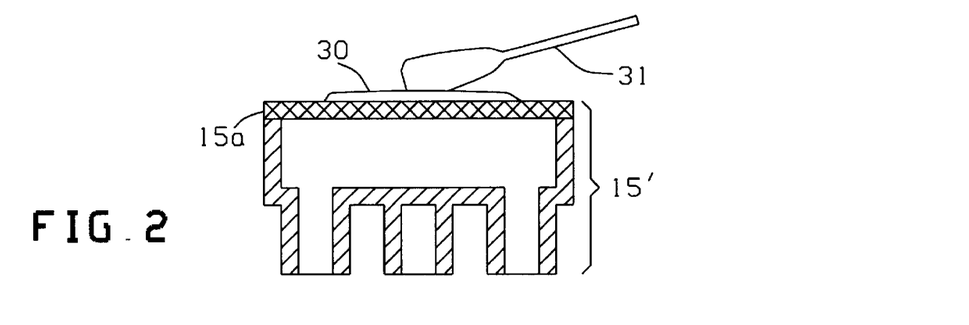
FIG. 2 shows a novel jacket in the FIG. 1 assembly at an initial stage of fabrication.

FIG. 2 shows a jacket 15' which is the jacket 15 at an initial stage of manufacturing. This jacket 15' has a bottom section 15a of a predetermined metal, which is different than the material in the chip 23 that the bottom section 15a will face in the FIG. 1 assembly. On this bottom section 15a, a layer of a solder flux 30 is disposed by a cotton swab 31 or by spraying.

Figure 3:
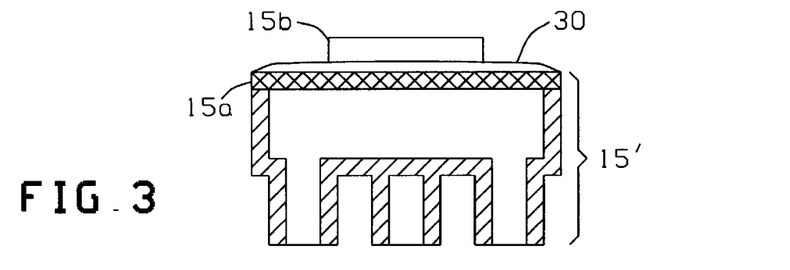
FIG. 3 shows the jacket of FIG. 2 at a second stage of fabrication.

Next, as shown in FIG. 3, a solid piece of a metal alloy 15b is placed on the flux 30. This metal alloy 15b is selected to be of a type which—a) wets the metal of which the bottom section 15a is made, and b) does not wet the material in the integrated circuit chip 23 which the bottom section 15a will face.

Figure 4:
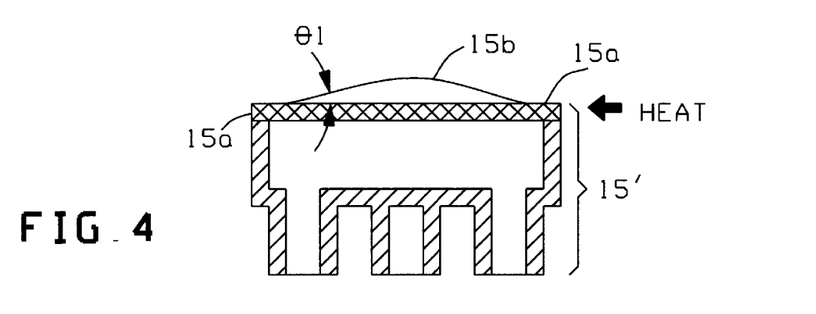
FIG. 4 shows the jacket of FIG. 2 at a third stage of fabrication.

Next, the flux 30 and the metal alloy 15b are heated by an external heat source to a temperature which places the alloy 15b in a liquid/slurry state. This is shown in FIG. 4. Since the alloy 15b is of a type which wets the metal from which the bottom section 15a is made, the contact angle θ1 between the bottom section 15a and the alloy 15b, as measured through the alloy in the liquid/slurry state, lies between 0° and 90°.

Figure 5:
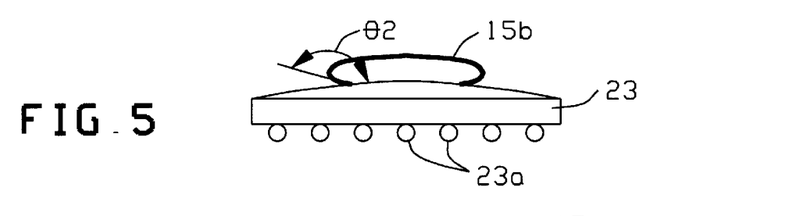
FIG. 5 illustrates a particular characteristic of a metal alloy which is used in FIGS. 3 and 4.
Figure 6:
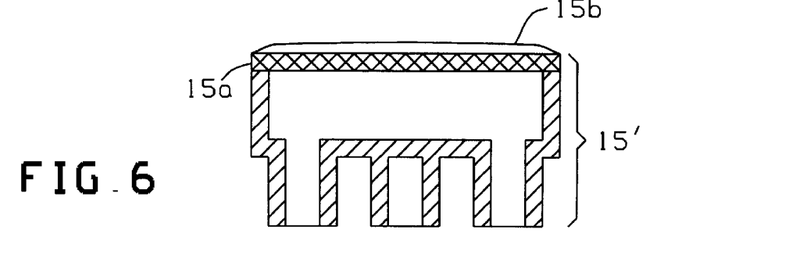
FIG. 6 shows the jacket of FIG. 2 at a final stage of fabrication.

By comparison, since the alloy 15b does not wet the material in the integrated circuit chip 23 which will be faced by the bottom section 15a, the contact angle θ2 between that material on the chip and the alloy 15b, as measured through the alloy in the liquid/slurry state, lies between 90° and 180°. This is shown in FIG. 5.

Thereafter, the alloy 15b on the bottom section 15a is cooled to a solid state; and any excess flux is washed off of the alloy. Since the alloy 15b wet the bottom section 15a, that alloy in a solid state will adhere to the bottom section 15a. Conversely, since the alloy 15b in a liquid/slurry state does not wet the material in the integrated circuit chip 23 which will be faced by the bottom section 15a, that alloy will not adhere in a solid state to that material.

Each jacket 15 in the FIG. 1 assembly is fabricated by the above-described process. Then, the actual testing of the integrated circuit chips 23 in the FIG. 1 assembly occurs in the sequence of steps which are illustrated in FIGS. 7–9.

When a jacket 15 in the FIG. 1 assembly is initially pressed against an integrated circuit chip 23, an irregular-shaped gap will exist between the jacket 15 and the integrated circuit chip 23. This gap is indicated in FIG. 7 by reference numeral 40; and it will have a different shape for each chip in the FIG. 1 assembly.

Figure 8:
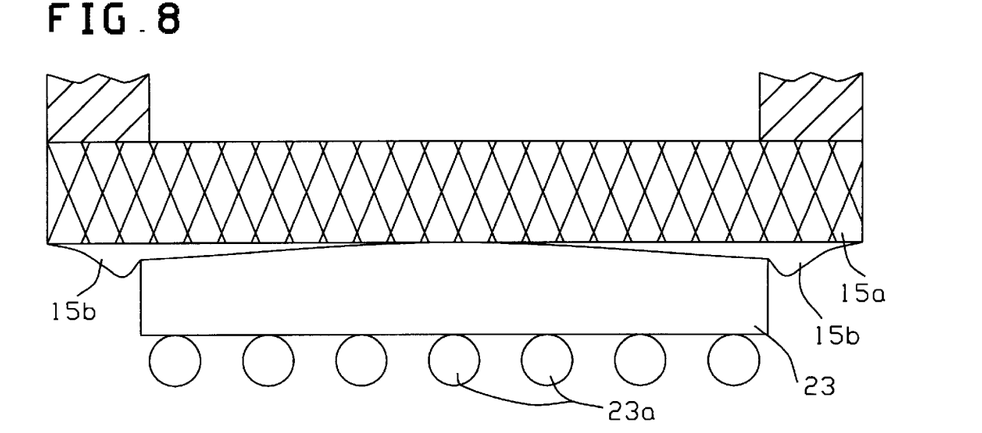
FIG. 8 shows the jacket of FIG. 6 when it is be heated in the FIG. 1 assembly while being pressed against an integrated circuit chip.
Figure 9:
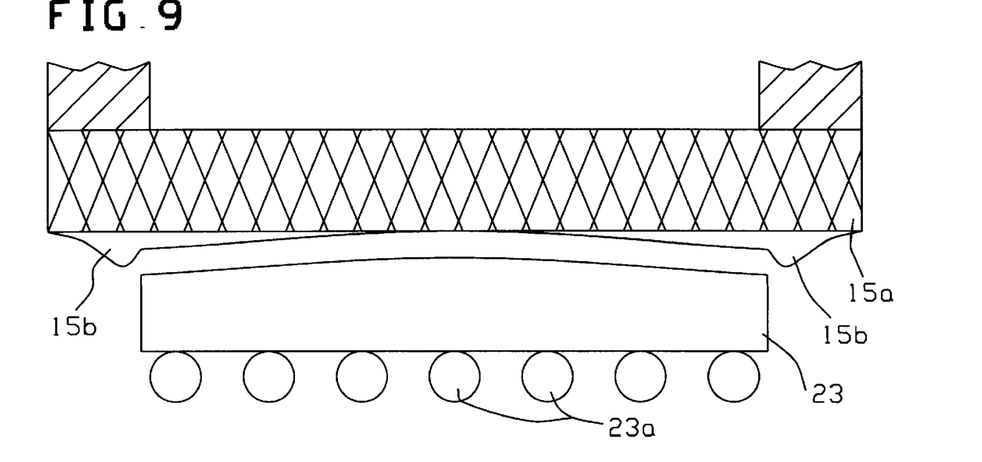
FIG. 9 shows the jacket of FIG. 6 when it is separated from an integrated circuit chip in the FIG. 1 assembly.

Thereafter, as shown in FIG. 8, the metal alloy 15b on the bottom section 15a of each jacket is heated to a temperature which puts that alloy in a slurry/liquid state. While the alloy 15b is in the slurry/liquid state, the springs 20 in the FIG. 1 assembly force the jackets 15 against the chips 23, and that squeezes the alloy 15b into the irregular shaped gaps between the jackets and the chips. This alloy 15b substantially fills the gaps and varies in thickness from zero to thirty mils.

Figure 7:
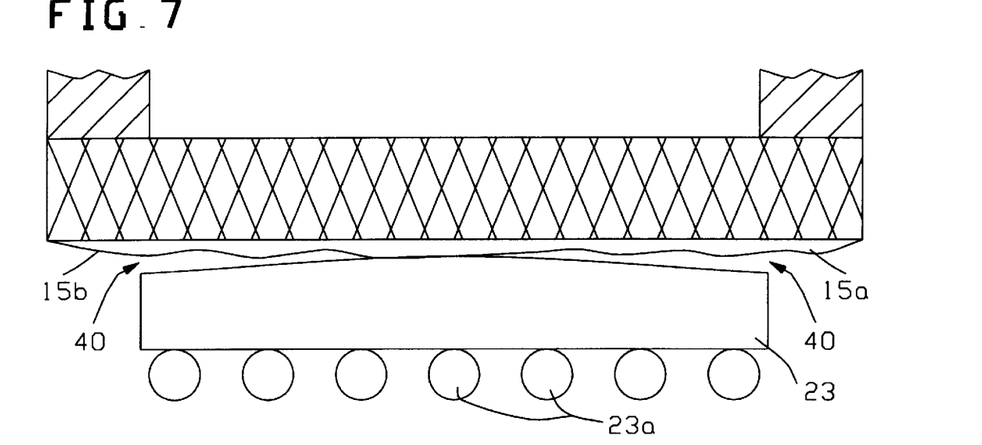
FIG. 7 shows the jacket of FIG. 6 when it is initially pressed in the FIG. 1 assembly against an integrated circuit chip.

In order to convert the solid alloy 15b of FIG. 7 to the liquid/slurry alloy of FIG. 8, heat can be applied to the FIG. 1 assembly from an external heat source. Alternatively, electrical power and input signals can be applied to selected terminals 23a of the integrated circuit chips 23 which cause the chips to generate heat and thereby put the metal alloy 15b in the slurry/liquid state.

After the gaps 40 have been filled with the metal alloy 15b as shown in FIG. 8, each of the integrated circuit chips is subjected to the burn-in test. During this test, the metal alloy 15b may be maintained in either the slurry/liquid state or in the solid state. In either case, the thermal resistance in the FIG. 8 structure between each integrated circuit chip 23 and its jacket 15 will be reduced by several hundred percent, in comparison to the FIG. 7 structure.

Thereafter, when the burn-in test is complete, the alloy 15b is cooled to a temperature which places it in a solid state. That enables each of the integrated circuit modules 22 to be removed from the FIG. 1 assembly without any residue of a foreign material being transferred to the chip 23. Such removal of the integrated circuit modules from the FIG. 1 assembly is made possible because in a solid state, the alloy 15b adheres to the bottom section 15a of the jackets, but not to the different material in the portion of the chip 23 which faces the jackets.

Figure 10:
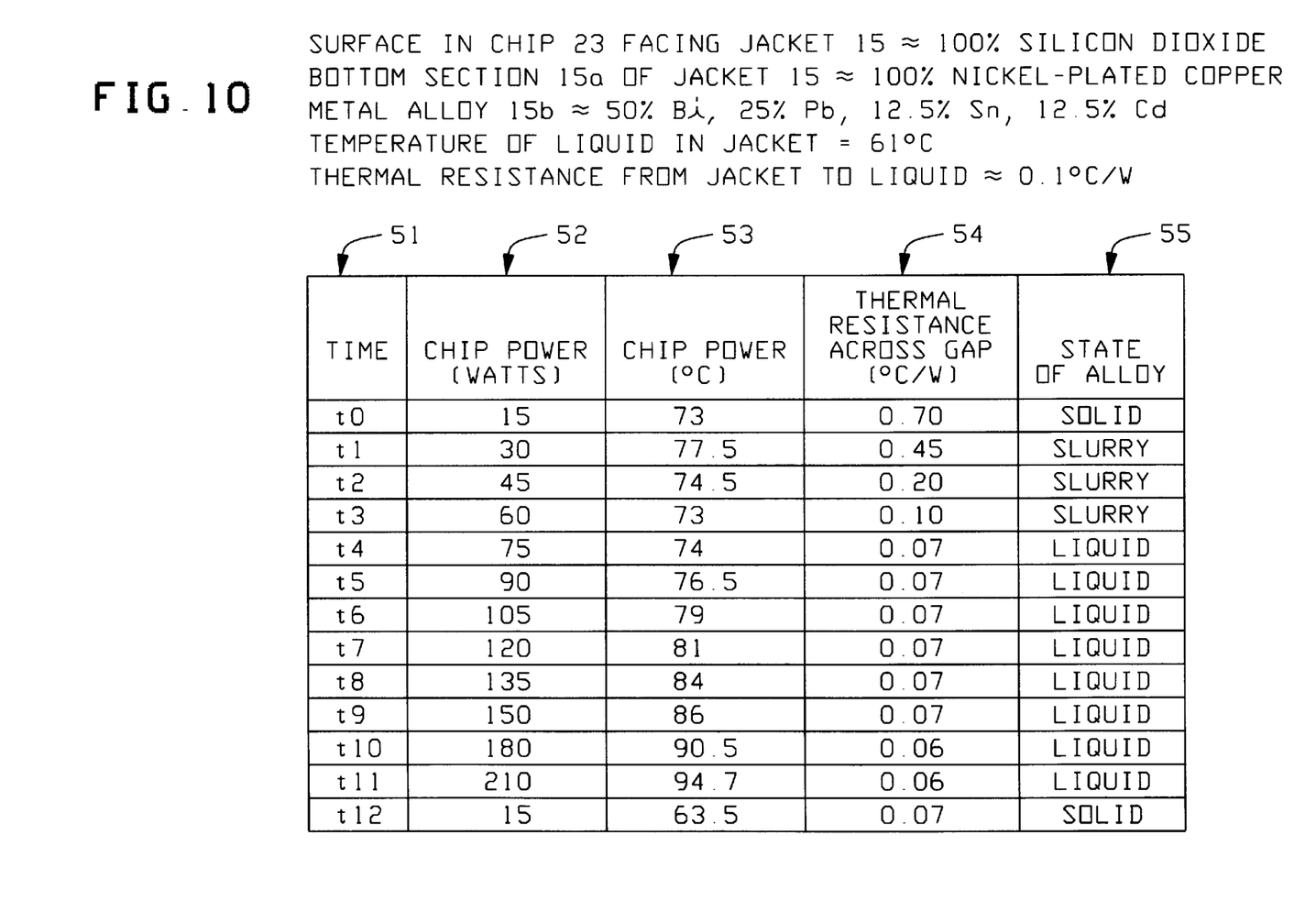
FIG. 10 shows an example of an actual experiment which verifies the present invention.

One specific example of an actual experiment which verifies the present invention is illustrated in FIG. 10. In this experiment, the bottom section 15a of the jacket was approximately 100% nickel-plated copper; the alloy 15b was approximately 50% bismuth, 25% lead, 12.5% tin, and 12.5% cadmium; the surface of the chip 11 which faced the bottom section 15a of the jacket was approximately 100% silicon dioxide and its size was 1.55 cm by 1.55 cm; the temperature of the liquid in the jacket was held essentially constant at 61° C.; and the thermal resistance from the jacket to the liquid was constant at 0.1° C./W.

Initially, the structure which was used in the above experiment corresponded to the structure of FIG. 7. Thus an irregular shaped air gap 40 initially existed between the chip 23 and the alloy 15b on the jacket 15. Starting with that FIG. 7 structure, the power which the chip 23 dissipated was varied as listed in column 52 of FIG. 10.

At time t0, when the air gap 40 existed, the chip dissipated 15 watts and the resulting chip temperature was 73°. Thus the thermal resistance between the chip 23 and the liquid in the jacket 15 was (73° C.–61° C.)÷15 or 0.80° C./W; and so the thermal resistance between the chip and the jacket was 0.80° C./W–0.10° C./W or 0.70° C./w.

Thereafter, at times t1, t2 and t3, the power which the chip 23 dissipated was increased to 30 watts, 45 watts, and 60 watts respectively. Due to this power increase, the alloy 15b on the jacket changed from a solid state to a slurry state.

This slurry state alloy 15b fluid became more fluid as the chip power dissipation increased; and consequently, more of the alloy 15b was squeezed into the gap 40 as the chip power dissipation increased. Thus, when the chip dissipated 30 watts, the thermal resistance dropped to 0.45° C./W; when the chip dissipated 45 watts, the thermal resistance dropped to 0.20° C./W; and when the chip dissipated 60 watts, the thermal resistance dropped to 0.10° C./W.

Thereafter, at times t4 thru t11, the chip power dissipation was further increased to 75 watts, 90 watts, etc. as shown in column 52 of FIG. 10. Due to that high level of power dissipation, the alloy 15b was put in a liquid state; and thus it substantially filled the gap 40. Consequently, the thermal resistance dropped to its lowest level of 0.06° C./W to 0.07° C./W.

Subsequently, at time t12, the chip power dissipation was decreased to 15 watts. As a result, the metal alloy 15b was put back into a solid state. However, the thermal resistance between the chip 11 and the jacket 15 remained at the low level of 0.07° C./W because the alloy 15b in its solid state continued to fill the gap.

Following time t12, all input power to the chip 11 was turned off. Then, the chip was separated from the jacket 15 as shown in FIG. 9; and all of the alloy 15b was adhered in a solid state to the bottom section 15a of the jacket.

One preferred embodiment of an electromechanical assembly which incorporates the present invention has now been described in detail. In addition however, many changes and modifications can be made to the details of this particular embodiment without departing from the gist or essence of the present invention.

Figure 11:
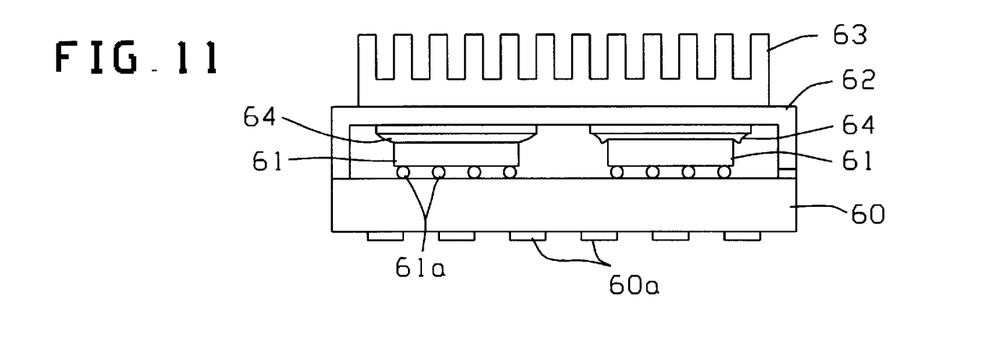
FIG. 11 shows a second preferred embodiment of an electromechanical assembly which incorporates the present invention.

As one such modification, FIG. 11 shows another preferred embodiment of an electromechanical assembly which incorporates the present invention. This FIG. 11 embodiment includes several components 60–64 and each of those components is described below in Table II.

TABLE II

| Item | Description |
| --- | --- |
| 60 | Item 60 is a substrate which has input/output terminals 60a. |
| 61 | Each item 61 is an integrated circuit chip which has input/output terminals 61a that are soldered to corresponding input/output pads (not shown) on the substrate 60. |
| 62 | Item 62 is a metal cap which encloses the chips 61 and is attached at its perimeter by an epoxy to the substrate 60. |
| 63 | Item 63 is a heat sink with cooling fins. |
| 64 | Each item 64 is a metal alloy. |

In the FIG. 11 embodiment, the metal alloy 64 fills respective gaps which exists between each integrated circuit chip 61 and the metal cap 62. Each gap varies in size due to various manufacturing tolerances. For example, the chip 61 on the left-hand side of FIG. 11 is shown as being relatively thin, whereas the chip 61 on the right-hand side of FIG. 11 is shown as being relatively thick. In each case, however, the metal alloy 64 fills the gap; and thus the thermal resistance between each chip 61 and the metal cap 62 is reduced by several hundred percent from what it would otherwise be if the alloy 64 were eliminated.

Also, in the FIG. 11 embodiment, the alloy 64 is selected to be an alloy which—a) wets the portions of the cap 62 which lie directly over the chips 61, and b) does not wet the material in the integrated circuit chip 61 which the metal alloy contacts. Due to this limitation, the metal alloy 64 will adhere in a solid state to the cap 62 but will not adhere in a solid state to the chip 61. Consequently, if one of the chips 61 happens to fail in the FIG. 11 embodiment, that problem can be fixed by removing the cap 62 from the substrate 60 while the metal alloy 64 is in a solid state, replacing the defective chip on the substrate 60, and reattaching the cap 62 to the substrate 60.

Figure 12:
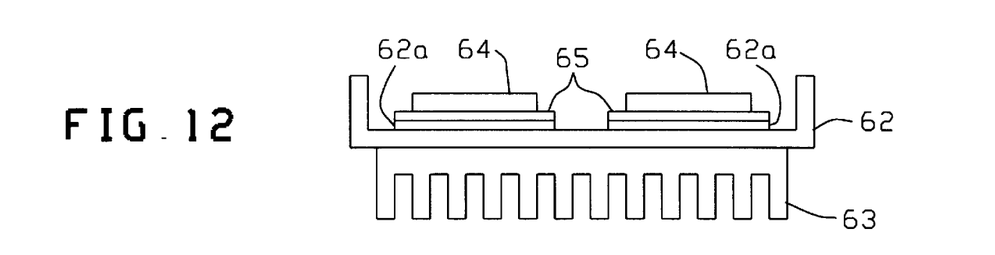
FIG. 12 shows the FIG. 11 assembly at an initial stage of fabrication.
Figure 13:
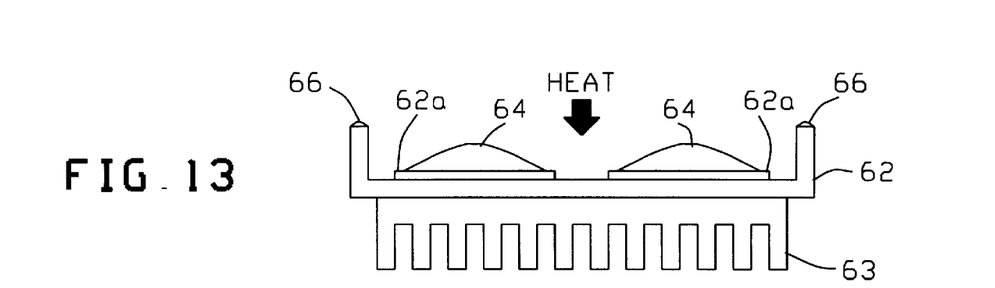
FIG. 13 shows the assembly of FIG. 11 at a second stage of fabrication.
Figure 14:
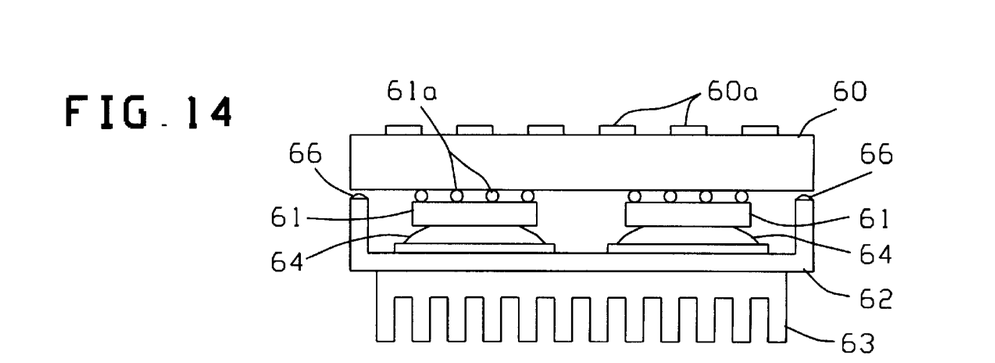
FIG. 14 shows the assembly of FIG. 11 at a third stage of fabrication.

One particular process by which the FIG. 11 embodiment is manufactured is illustrated in FIGS. 12–14. Initially, the metal cap 62 is made of aluminum. Then, the portions 62a of the cap which lie directly over the chips 61 in the FIG. 11 assembly are nickel-plated. Next, the nickel portions 62a of the cap are coated with a flux 65; and then two solid pieces of the metal alloy 64 are placed in the flux as shown in FIG. 12. This alloy 65 is one which wets nickel, but does not wet aluminum and does not wet silicon dioxide. For example, the alloy 65 is 42.5%, bismuth, 37.7% lead, 11.3% tin, and 8.5% cadmium.

Thereafter, the entire perimeter of the cap 62 is coated with an epoxy 66; and then the alloy 64 is heated by an external heat source to a slurry state. This produces a structure as shown in FIG. 13.

Then, while the alloy 64 is in the slurry state, the chips 61 on the substrate 60 are pushed against the metal alloy 64 as shown in FIG. 14. This pushing continues until the perimeter of the metal cap 62 is pushed against the substrate. At that point, the alloy 64 fills the respective gaps between the chips 61 and the cap 62. Then the alloy 64 is cooled to a solid state, and the epoxy 66 between the cap 62 and the substrate is allowed to cure.

Each chip 61 on the substrate 60 is fabricated in a conventional fashion such that its backside surface which contacts the alloy 64, as well as the sides of the chip, consist of silicon dioxide. Thus in the assembly of FIG. 14, the slurry/liquid alloy 64 does not wet the surfaces which it contacts on the chip 61; and so in the completed assembly of FIG. 11, the solid alloy 64 does not adhere to the chip 61.

Following the above steps, the resulting structure is ready to be incorporated into an end product. In that end product, the chips 61 can be operated at a temperature which puts the alloy 64 in a solid state, or a slurry state, or a liquid state. If the alloy 64 is placed in a slurry/liquid state, that alloy will remain in the gap between the chips 61 and the cap 62 due to the surface tension in the alloy.

As another modification, the alloy 15b in the embodiment of the FIGS. 1–9 and the alloy 64 in the embodiment of FIGS. 11–14 can consist of essentially an infinite number of combinations of two or more metals. Preferably, these metals include lead, tin, bismuth, cadmium, indium, and antimony. By combining selected quantities of these materials, the transition temperatures (at which the alloy changes from a solid to a slurry, or from a slurry to a liquid, or from a solid to a liquid) can be adjusted as desired. For example, alloys with over fifty different transition temperatures are available from Indium Corporation of Utica, N.Y.

Further, in another modification a single metal can be used in place of the above alloys if a single metal exists which has the desired transition temperature from a liquid to a solid. Also, the above alloys or single metal can be mixed with extremely small particles of non-metals which have a higher thermal conductivity than the alloy/metal by itself. Examples of such non-metal particles include diamond dust, or graphite, or boron nitride.

Similarly, as another modification, the jacket in the embodiment of FIGS. 1–9 and the cap 62 in the embodiment of the FIGS. 11–14 can have a surface to which the alloy/single metal adheres, that is made of many different materials. For example, the jacket 15 and the cap 62 can be made in their entirety of copper, nickel or zinc. Alternatively, the jacket 15 and the cap 62 can be made of aluminum, and the portion of the jacket 15 and the cap 62 which contact the alloy/single metal can be plated with copper, nickel, or zinc.

As another similar modification, the integrated circuit chip 23 in the embodiment of FIGS. 1–9 and the integrated circuit chip 61 in the embodiment of FIGS. 11–14 can have a surface which contacts the alloy/single metal that is made of any material to which the alloy/single metal will not adhere. For example, these materials include silicon, silicon dioxide, aluminum nitride, and ceramic.

As still another modification, the integrated circuit chip 23 in the embodiment of FIGS. 1–9 and the integrated circuit chip 61 in the embodiment of FIGS. 11–14 can be replaced by any heat generating unit. For example, those chips can be replaced by an electric power converter, such as a DC-DC converter or an AC transformer. Similarly, those chips 23 and 61 can be replaced by an integrated circuit module in which one or ore chips are enclosed in a package, such as a ceramic package.

As still another modification, an electromechanical assembly can be formed which includes a pressed joint between any two components which is similar in structure to the pressed joint in the embodiments of FIG. 1 and FIG. 11. Such an assembly includes a first component having a contact surface of a particular material; a second component having a contact surface of a different material; and, a film of an metal alloy/single metal which is squeezed between the contact surfaces and which adheres in a solid state to one of the particular and different materials, but not the other material.

Initially when the joint is formed, the alloy/single metal in the joint is heated to a slurry/liquid state; and thus, any microscopic air gaps between the contact surface of the two components are essentially eliminated. Therefore, heat can be conducted through the joint while the alloy/single metal is in a solid state, or slurry state, or a liquid state.

To disassemble the pressed joint, the alloy/single metal is cooled to a solid state. Then the contact surfaces are moved apart with the alloy/single metal attached in the solid state to just the one material. Alternatively, to disassemble the above pressed joint, the alloy/single metal can be cooled to a slurry/liquid state. Then the contact surfaces can be moved apart with the alloy/single metal attached by surface tension in the slurry/liquid to just the one material.

What is claimed is:

1. A reusable testing assembly for sequentially testing multiple integrated circuit modules where each module is of a type which has a first contact surface that consists of a first material; said reusable testing assembly comprising:

a holding means for sequentially holding each particular integrated circuit module while it is tested;

a hollow jacket that carries a liquid and has a second contact surface which forms an irregular shaped gap when pushed directly against said first contact surface of said particular module; said second contact surface consisting of a second material which completely covers and extends past said first contact surface;

a coating of a thermal conductor which covers the entire second contact surface of said hollow jacket and which is selected from the group of (1) a metal alloy which adheres in a solid state to said second material but not said first material, and (2) a single metal which adheres in a solid state to said second material but not said first material;

a moveable squeezing means which is moved to one position for squeezing said second contact surface directly against said first contact surface of said particular module held by said holding means while said thermal conductor is lying therebetween in a liquid/slurry state, and is moved to another position for allowing said particular module to be removed from said holding means while said thermal conductor is in a solid state; and, said coating of a thermal conductor being characterized as having a solid central region with the irregular shape of said gap for said particular module and having a solid ridge which extends around said central region, when said particular module is removed from said holding means, with said central region and said ridge having a combined mass which stays constant for all of said modules that are tested.

2. An assembly according to claim 1 wherein said first material is silicon dioxide; said second material is copper, nickel or zinc; and said thermal conductor includes at least two metals selected from the group of lead, tin, bismuth, cadmium, indium, and antimony.

3. An assembly according to claim 1 wherein said first material is ceramic; said second material is copper, nickel or zinc; and said thermal conductor includes at least two metals selected from the group of lead, tin, bismuth, cadmium, indium, and antimony.

4. An assembly according to claim 1 wherein said thermal conductor includes two or more metals selected from the group of lead, tin, bismuth, cadmium, indium, and antimony, that are mixed with non-metal particles which have a higher thermal conductivity than the metals that are selected from said group.

5. An assembly according to claim 1 wherein said first contact surface is an external portion of an integrated circuit chip.

6. An assembly according to claim 1 wherein said first contact surface is an external portion of a package which encloses an integrated circuit chip.

7. An assembly according to claim 1 wherein said thermal conductor has a thickness which varies within the range of 0–30 mils.

* * * * *